United States Patent [19]

Sato et al.

[11] Patent Number: 4,672,185

[45] Date of Patent: Jun. 9, 1987

[54] CONTROL SYSTEM FOR SEMICONDUCTOR SUBSTRATE PROCESS LINE

[75] Inventors: Mitsuo Sato, Zama; Hiroshi Kamidoi, Hyogo, both of Japan

[73] Assignee: Kabushiki Kaisha Toshiba, Kawasaki, Japan

[21] Appl. No.: 802,374

[22] Filed: Nov. 27, 1985

[30] Foreign Application Priority Data

Nov. 28, 1984 [JP] Japan .................................. 59-249708

[51] Int. Cl.⁴ .............................................. G06K 7/10
[52] U.S. Cl. ..................................... 235/462; 235/454
[58] Field of Search ................................ 235/454, 462

[56] References Cited

U.S. PATENT DOCUMENTS 4,293,676 10/1981 Long .................................. 235/462X Primary Examiner—Harold I. Pitts
Attorney, Agent, or Firm—Finnegan, Henderson, Farabow, Garrett & Dunner

[57] ABSTRACT

A control system for a semiconductor substrate process line comprises a process line having processing units for processing a semiconductor wafer in accordance with preset data, a plurality of cassettes each for storing a plurality of semiconductor wafers and having an identification member on a surface thereof consisting of a plurality of projections arranged in a row, a non-contact type number reader provided at an entrance side of the processing unit for reading the cassette number designated by the identification member and generating a signal corresponding to the number, and a control unit in which processing conditions are input corresponding to the semiconductor wafers stored in the cassettes and which identifies the signal from the reader and controls the processing unit under processing conditions corresponding to the identified number.

8 Claims, 4 Drawing Figures

F I G. 2
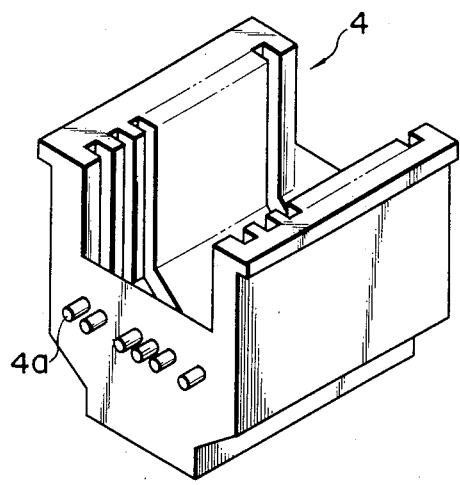
F I G. 3
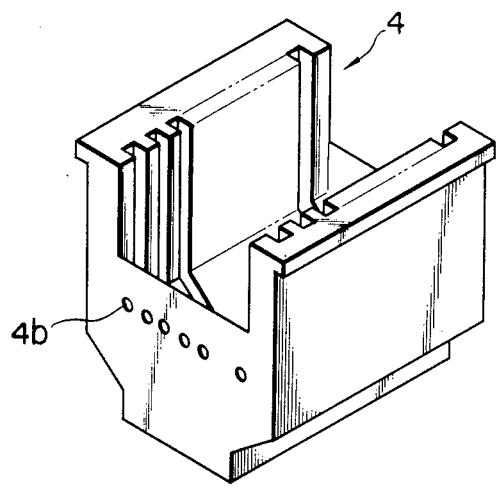
F I G. 4
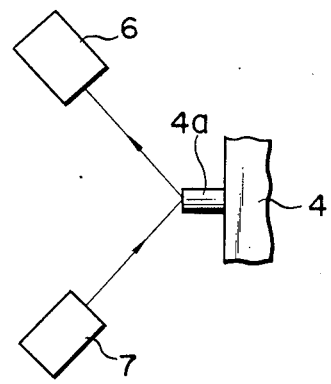

CONTROL SYSTEM FOR SEMICONDUCTOR SUBSTRATE PROCESS LINE

BACKGROUND OF THE INVENTION

The present invention relates to a control system for a semiconductor substrate process line and, more particularly, to a wafer control system for a wafer process wherein semiconductor substrates or wafers are stored in a cassette and processed.

As is well known, the semiconductor device manufacturing process can be roughly divided into two processes: a so-called wafer process, for forming elements in a semiconductor wafer, and a mounting process, for cutting the semiconductor wafer after element formation into chips and sealing the chip in a package. In the wafer process, semiconductor wafers are sliced from a monocrystalline semiconductor ingot, stored in a semiconductor substrate storage cassette (conveyance container) in units of, e.g., 25 pieces, and conveyed to various types of processing units. The type symbol, the lot number, process conditions, and so on of semiconductor wafers are set in units of cassettes. The processing units process in units of cassettes or wafers.

In the conventional wafer process, a type symbol, a lot number and a wafer number are directly marked on each wafer. Alternatively, a cassette number is assigned and a process slip is attached to each cassette, and the cassettes are sequentially conveyed to the processing units. The process slip has a type symbol, a cassette number, a lot number, and a process sequence specific to each lot.

In the latter wafer process, the process slip for lot control is removed from each cassette at the entrance of each processing unit and is stored in a process storage box near the processing unit. After all the wafers in the cassette have been processed, a process slip corresponding to the cassette is selected from the storage box by checking the cassette number, and is reattached to the cassette at the exit of the processing unit. With this system, when the process slip is selected from the storage box, the operator may pick the wrong slip. Thus, a slip that does not correspond to the semiconductor wafers in the cassette is erroneously attached to the cassette. Great confusion results in the wafer process, sometimes causing defective products. In addition, since it takes time to pick out the corresponding slip from the process slip storage box, cassette conveyance in the wafer process is slow, and productivity suffers.

SUMMARY OF THE INVENTION

It is an object of the present invention to provide a control system for a semiconductor substrate process line, wherein the entire wafer process is fully automated, and cassettes can be quickly and effectively conveyed.

A control system according to the present invention comprises:

a process line having at least one processing unit capable of processing a semiconductor wafer in accordance with preset data;

a plurality of cassettes each for storing a plurality of semiconductor wafers and having an identification member on a surface thereof consisting of at least one projection or recess, different cassette numbers being assigned to the plurality of cassettes by means of presence/absence of the projection or recess;

a non-contact type number reader provided at an entrance side of the processing unit for reading the cassette number designated by the identification member without contacting the cassette and generating a signal corresponding to the number; and a control unit in which processing conditions are input corresponding to the semiconductor wafers stored in the cassettes and which identifies the signal from the reader, and controls the processing unit under a processing conditions corresponding to the identified number.

BRIEF DESCRIPTION OF THE DRAWINGS

FIGS. 2 and 3 are perspective views of different examples of a semiconductor substrate storage cassette usable in the control system of the present invention; and FIG. 4 is a schematic side view of an example of a reader.

DETAILED DESCRIPTION OF THE PREFERRED EMBODIMENT

Figure 1:
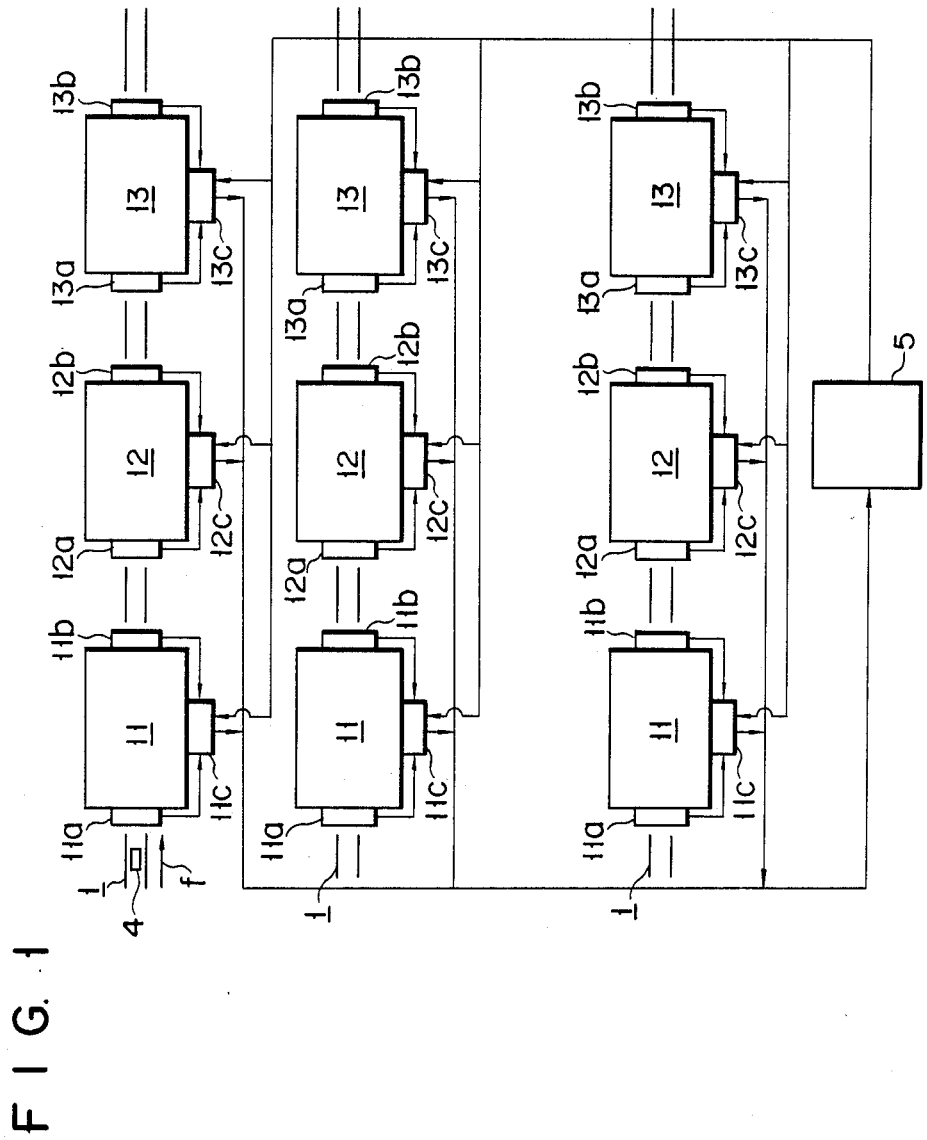
FIG. 1 is a schematic diagram of a control system according to an embodiment of the present invention.

A control system for a semiconductor substrate process line according to an embodiment of the present invention will be described hereinafter with reference to the accompanying drawings.

Referring to FIG. 1, reference numeral 1 denotes semiconductor substrate process lines arranged parallel to each other in the wafer process. Various known semiconductor substrate processing units 11, 12 and 13 are sequentially arranged in series along each process line 1. A semiconductor substrate storage cassette 4 storing semiconductor wafers is conveyed along each process line by a known conveying means, e.g., a belt conveyor, in the direction of arrow f. The semiconductor wafers in the cassette 4 are subjected to predetermined processing, e.g., etching, by the respective processing units.

Non-contact type number readers 11a, 12a and 13aand 11b, 12b and 13b for reading the binary identification number, i.e., the cassette number, on the surface of the cassette are provided at the entrance and exit sides of processing units. Individual control units 11c, 12c and 13c are provided for each processing unit. The units 11c, 12c and 13c identify the cassette 4 passing through the corresponding processing unit in accordance with output signals from the corresponding readers, detect and record the time when the cassette enters and leaves the processing unit, and monitor and record the operating state of the processing unit. The units 11c, 12c and 13c have signal transmission/reception functions and are connected to a common central processing unit 5 through transmission lines. The CPU 5 identifies cassettes and their positions throughout the entire process line and simultaneously supervises the operating states of the respective processing units to which the cassettes have been conveyed, in accordance with input data from the units 11c, 12c and 13c. When the processing units are not in predetermined states, e.g., when the processing units must not be operated in accordance with the information on the process slip input to the individual control units, the CPU 5 temporarily stops the processing units or conveying units through the individual control units and warns the operator. The thin lines with arrows in FIG. 1 represent signal transmission lines.

The cassette 4 as shown in FIG. 2 is formed by integral molding of a synthetic resin such as Teflon which has good heat and chemical resistance. The cassette 4 has a body of a substantially U-shaped cross section with a plurality of grooves on the inner surface thereof for receiving a plurality of semiconductor wafers aligned therein at predetermined intervals. A plurality (eight in this embodiment; two of them are omitted and six are shown in FIG. 2) of projections 4a are formed on an end surface of the cassette 4 and aligned in a row. With this arrangement, by removing a predetermined projection with, e.g., a drill, the identification number of the cassette 4 can be represented in binary code. The presence of a projection 4a represents a 1 in binary code, and the absence of a projection represents a 0. Hence, when hexadecimal notation (16 projections) is used, different cassette numbers can be sequentially assigned to 65,000 cassettes.

When the cassette number is thus represented by the projections on the surface of the cassette, even if the wafer is processed with strong acid during semiconductor wafer processing, the wafer number, i.e., the projections remains safe. When data which is conventionally attached to a process slip is input to the individual control units, peeling the process slips from the cassettes at the entrance of the processing unit and reattaching them later becomes unnecessary. In this way, a fully automatic control system is possible.

The projections for representing the cassette number are preferably formed by molding them integrally with the cassette. When a binary 0 is to be represented, projections can be removed afterward or are simply not formed. Binary code representation may also be reversed, so that the presence of a projection represents a 0 and the absence of one represents a 1. The representation method of the cassette number is not limited to binary code. Representation may also be performed using projections formed at predetermined portions of a matrix.

In the present embodiment, projections are used as members for representing the cassette number. However, a through hole 4b as shown in FIG. 3 can also be used. In this case, through holes are selectively filled to represent a desired identification number. The through holes can also be formed in advance.

The non-contact type number reader may be of any type which can read the identification member, consisting of projections and recesses formed on the surface of the cassette, without contacting it. For example, as shown in FIG. 4, a light-emitting element 6 for emitting a light beam toward the identification member and a light-receiving element 7 for receiving a light beam reflected from the identification member can be combined to constitute a photoelectric switch, and used as the non-contact type number reader. In this case, it is preferable to arrange the photoelectric switch such that the element 6 emits the light beam toward a flat distal end face of the projection 4a and the element 7 receives the reflected light beam from the distal end face. The light-emitting element preferably comprises an infrared light-emitting element in order to minimize adverse effects from external light. Furthermore, ambient light is normally incident from above. Thus, the light-receiving element is preferably located at a level (See FIG. 4) higher than the light-emitting element, so that downward ambient light does not become incident on the light-receiving element. In addition, the distal end face of the projection should be rough so that light is not absorbed. A number of such photoelectric switches, each comprising light-emitting and light-receiving elements, can be used, one for each projection. In this case, the cassette number is identified by the detection/nondetection of each projection by the respective light-receiving elements. It is also possible to use only one such switch, moving it along the row of projections to sequentially detect the presence or absence of projections.

As noted above, with the control sytem of the present invention, peeling the process slip from a cassette at the entrance of each processing unit and later reattaching the slip to the cassette becomes unnecessary. All cassettes in all process lines can be controlled while all processing units are simultaneously monitored fully automatically. Process line automation in the wafer process is thus easily accomplished, resulting in improved productivity and manufacturing yield in the wafer process. When a contact-type reader is used, the contacting portion may be damaged or become corroded by the chemical substances used in a processing unit, thereby resulting in erroneous readings. In the present invention, however, a non-contact type reader is adopted for detecting the cassette number identification member, thus preventing such conventional drawbacks.

What is claimed is:

1. A control system for a semiconductor substrate process line, comprising:
   a process line having at least one processing unit for processing a semiconductor wafer in accordance with preset data;
   a plurality of cassettes each for storing a plurality of semiconductor wafers and having an identification member on a surface thereof consisting of at least one projection or recess, different cassette numbers being assigned to said plurality of cassettes by means of presence/absence of said projection or recess;
   a non-contact type number reader provided at an entrance side of said processing unit for reading the cassette number designated by said identification member without contacting said cassette and generating a signal corresponding to the number; and
   a control unit in which processing conditions are input corresponding to the semiconductor wafers stored in said cassettes and which identifies the signal from said reader and controls said processing unit under processing conditions corresponding to the identified number.

2. A control system according to claim 1, wherein said identification members are formed in a row on a surface of each of said cassettes in order to allow binary code representation by means of the presence/absence of said projections.

3. A control system according to claim 2, wherein said cassette and said projections are integrally formed by molding of a synthetic resin having heat and chemical resistances.

4. A control system according to claim 1, wherein said non-contact type number reader comprises a lightemitting element for emitting a light beam toward said identification member and a light-receiving element for receiving a light beam reflected from said identification member.

5. A control system according to claim 4, wherein said identification member comprises a projection having a flat distal end face, and said light-emitting element emits a light beam toward said flat distal end face of said projection.

6. A control system according to claim 5, wherein said flat distal end face of said projection is roughly formed so as not to absorb the light beam.

7. A control system for a semiconductor substrate process line, comprising:
- a process line having a plurality of processing units capable of processing a semiconductor wafer in accordance with preset data;
- a plurality of cassettes for storing a plurality of semiconductor wafers and having an identification member formed on a surface thereof, different cassette numbers being assigned to said plurality of cassettes by means of presence/absence of said identification members;
- a number reader provided at an entrance side of each of said processing units for reading the cassette number designated by said identification member and generating a signal corresponding to the number;
- an individual control unit provided to correspond to each of said processing units, in which processing conditions are input corresponding to the semiconductor wafers stored in said cassettes and which identifies a signal from said reader and controls said processing unit under processing conditions corresponding to the identified number; and
- a central processing unit connected to said individual control unit for controlling said individual control unit based on information therefrom.

8. A control system according to claim 7, comprising another non-contact type number reader provided at an exit side of each of said processing units for reading the cassette number designated by said identification member and generating a signal corresponding to the number.

* * * * *